US009735256B2

(12) United States Patent
Chang et al.

(10) Patent No.: US 9,735,256 B2
(45) Date of Patent: Aug. 15, 2017

(54) METHOD AND STRUCTURE FOR FINFET COMPRISING PATTERNED OXIDE AND DIELECTRIC LAYER UNDER SPACER FEATURES

(71) Applicant: Taiwan Semiconductor Manufacturing Company, Ltd., Hsin-Chu (TW)

(72) Inventors: Che-Cheng Chang, New Taipei (TW); Chih-Han Lin, Hsinchu (TW); Jr-Jung Lin, Hsinchu (TW); Shih-Hao Chen, Hsin-Chu (TW); Mu-Tsang Lin, Changhua County (TW); Yung Jung Chang, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/799,057

(22) Filed: Jul. 14, 2015

(65) Prior Publication Data

US 2016/0111518 A1    Apr. 21, 2016

Related U.S. Application Data

(60) Provisional application No. 62/065,149, filed on Oct. 17, 2014.

(51) Int. Cl.
*H01L 21/336* (2006.01)
*H01L 29/66* (2006.01)
(Continued)

(52) U.S. Cl.
CPC .... *H01L 29/6681* (2013.01); *H01L 21/31116* (2013.01); *H01L 21/76224* (2013.01);
(Continued)

(58) Field of Classification Search
CPC .......... H01L 29/6681; H01L 29/66795; H01L 21/763; H01L 21/76224
(Continued)

(56) References Cited

U.S. PATENT DOCUMENTS 6,025,635 A * 2/2000 Krivokapic ....... H01L 21/28114
257/288
6,660,598 B2 * 12/2003 Hanafi .............. H01L 29/66545
257/E21.415
(Continued)

OTHER PUBLICATIONS

U.S. Appl. No. 14/456,241, filed on Aug. 11, 2014, by inventors Chun Hsiung Tsai and Jian-An Ke for "Method for Semiconductor Device Fabrication," 19 pages of text, 24 pages of drawings.

*Primary Examiner* — Lex Malsawma
*Assistant Examiner* — Eric Jones
(74) *Attorney, Agent, or Firm* — Haynes and Boone, LLP

(57) ABSTRACT

A semiconductor device and method of forming the same are disclosed. The method includes receiving a substrate having an active fin, an oxide layer over the active fin, a dummy gate stack over the oxide layer, and a spacer feature over the oxide layer and on sidewalls of the dummy gate stack. The method further includes removing the dummy gate stack, resulting in a first trench; etching the oxide layer in the first trench, resulting in a cavity underneath the spacer feature; depositing a dielectric material in the first trench and in the cavity; and etching in the first trench so as to expose the active fin, leaving a first portion of the dielectric material in the cavity.

20 Claims, 13 Drawing Sheets

(51) Int. Cl.
*H01L 21/762* (2006.01)
*H01L 29/78* (2006.01)
*H01L 21/311* (2006.01)

(52) U.S. Cl.
CPC ...... *H01L 29/6653* (2013.01); *H01L 29/6656* (2013.01); *H01L 29/66545* (2013.01); *H01L 29/785* (2013.01)

(58) Field of Classification Search
USPC ......... 438/157, 212, 591, 294–296; 257/410, 257/401, 406
See application file for complete search history.

(56) References Cited

U.S. PATENT DOCUMENTS

| | | | | |
|---|---|---|---|---|
| 7,902,029 | B2* | 3/2011 | Grupp | H01L 29/0895 438/295 |
| 8,361,869 | B2* | 1/2013 | Zhou | H01L 29/42376 257/308 |
| 8,487,378 | B2 | 7/2013 | Goto et al. | |
| 8,541,274 | B1* | 9/2013 | Xie | H01L 29/6681 257/E21.635 |
| 8,729,634 | B2 | 5/2014 | Shen et al. | |
| 8,815,693 | B2* | 8/2014 | Alptekin | H01L 29/66477 438/295 |
| 8,826,213 | B1 | 9/2014 | Ho et al. | |
| 8,887,106 | B2 | 11/2014 | Ho et al. | |
| 9,252,245 | B1* | 2/2016 | Akarvardar | H01L 29/6681 |
| 9,318,582 | B2* | 4/2016 | Basker | H01L 29/785 |
| 2005/0272192 | A1* | 12/2005 | Oh | H01L 29/66553 438/197 |
| 2006/0172497 | A1* | 8/2006 | Hareland | H01L 29/42384 438/286 |
| 2008/0299776 | A1* | 12/2008 | Bencher | H01L 21/0332 438/703 |
| 2009/0095980 | A1* | 4/2009 | Yu | H01L 29/66795 257/190 |
| 2009/0137093 | A1* | 5/2009 | Lin | H01L 27/10876 438/421 |
| 2010/0320605 | A1* | 12/2010 | Hwang | H01L 21/76897 257/751 |
| 2011/0186938 | A1* | 8/2011 | Li | H01L 21/302 257/408 |
| 2013/0032876 | A1* | 2/2013 | Cheng | H01L 29/66545 257/327 |
| 2013/0065371 | A1* | 3/2013 | Wei | H01L 21/76224 438/294 |
| 2013/0200459 | A1* | 8/2013 | Adam | H01L 29/66545 257/348 |
| 2014/0131776 | A1* | 5/2014 | Ching | H01L 29/66795 257/288 |
| 2014/0145242 | A1* | 5/2014 | Huang | H01L 21/82380 257/192 |
| 2014/0197456 | A1* | 7/2014 | Wang | H01L 29/785 257/192 |
| 2014/0197457 | A1* | 7/2014 | Wang | H01L 29/785 257/192 |
| 2014/0197458 | A1* | 7/2014 | Ching | H01L 29/7849 257/192 |
| 2014/0203334 | A1* | 7/2014 | Colinge | H01L 29/66545 257/288 |
| 2014/0239354 | A1* | 8/2014 | Huang | H01L 29/66545 257/288 |
| 2014/0239396 | A1* | 8/2014 | Liu | H01L 21/28008 257/347 |
| 2014/0282326 | A1 | 9/2014 | Chen et al. | |
| 2016/0260833 | A1* | 9/2016 | Basker | H01L 29/7853 |

* cited by examiner

METHOD AND STRUCTURE FOR FINFET COMPRISING PATTERNED OXIDE AND DIELECTRIC LAYER UNDER SPACER FEATURES

This claims the benefit of U.S. Prov. No. 62/065,149 entitled "Method and Structure for FinFET," filed Oct. 17, 2014, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a metal gate electrode instead of a typically polysilicon gate electrode. One process of forming a metal gate stack is termed a replacement-gate or "gate-last" process in which the final gate stack is fabricated "last" which allows for reduced number of subsequent processes, including high temperature processing, that is performed after formation of the gate. However, there are challenges to implementing such IC fabrication processes, especially with scaled down IC features in advanced process nodes, such as N20, N16 and beyond. One challenge is metal extrusion from the metal gate to nearby source/drain regions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
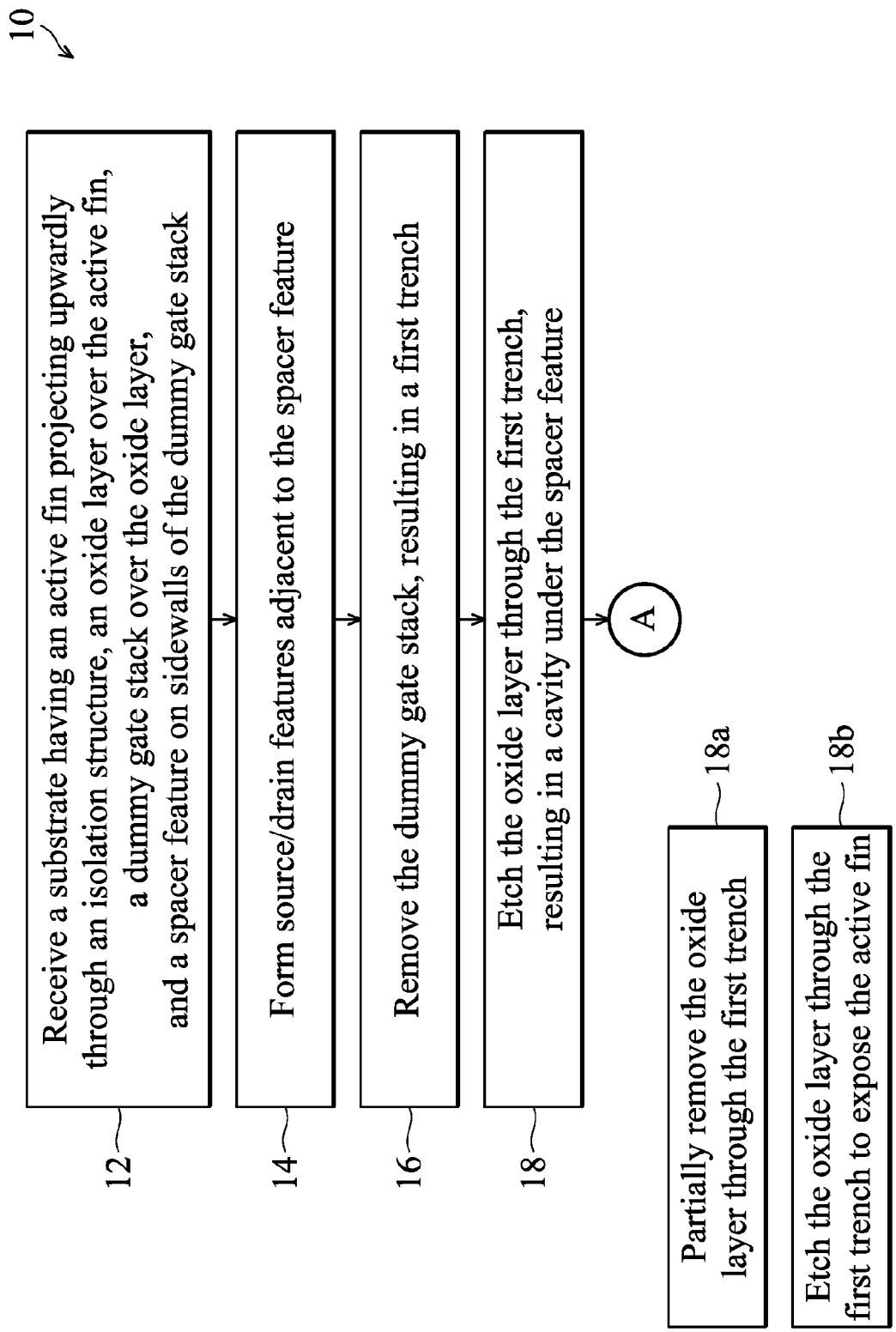
FIGS. 1A and 1B show a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having FinFETs. It is an objective of the present disclosure to provide methods and structures for effectively preventing metal extrusion in FinFET "gate-last" processes. In a gate-last process, a dummy gate stack is formed over a substrate as a placeholder for an actual gate stack. Then a spacer feature is formed surrounding the dummy gate stack. After source/drain features are formed adjacent to the spacer feature, the dummy gate stack is removed, leaving an opening surrounded by the spacer. Finally, a metal gate is formed in the opening. When the dummy gate stack is removed, an over-etching issue may occur, which results in a thin layer or no layer of isolation between the metal gate and the source/drain features. Consequently, metal materials diffuse from the metal gate into the source/drain features, causing manufacturing defects. The present disclosure provides methods and structures that address the above issue.

Figure 1B:
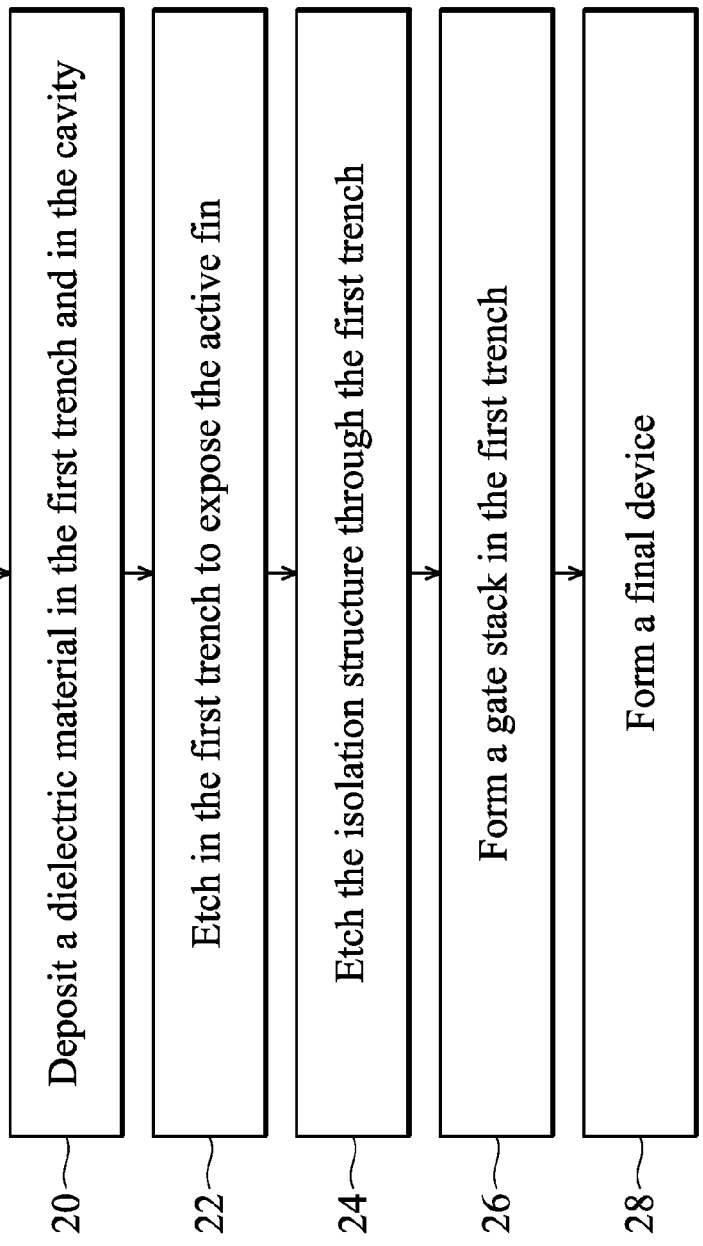

Referring now to FIGS. 1A and 1B, a flow chart of a method 10 of forming a semiconductor device is illustrated according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-13 that illustrate a portion of a semiconductor device 100 at various fabrication stages. The device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2B:
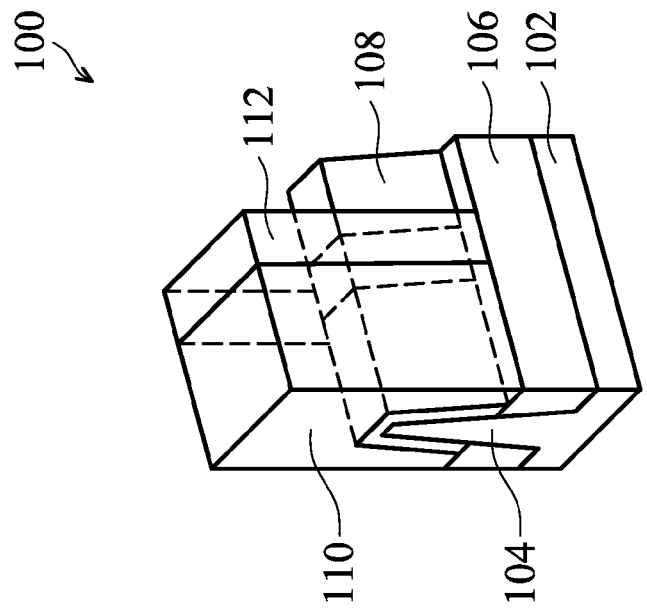
FIGS. 2A, 2B, 3, 4, 5, 6A, 6B, 6C, 6D, 7A, 7B, 8A, 8B, 8C, 9, 10A, 10B, 11, 12, and 13 are perspective and cross sectional views of forming a semiconductor device according to the method of FIGS. 1A and 1B, in accordance with some embodiments.
Figure 2A:
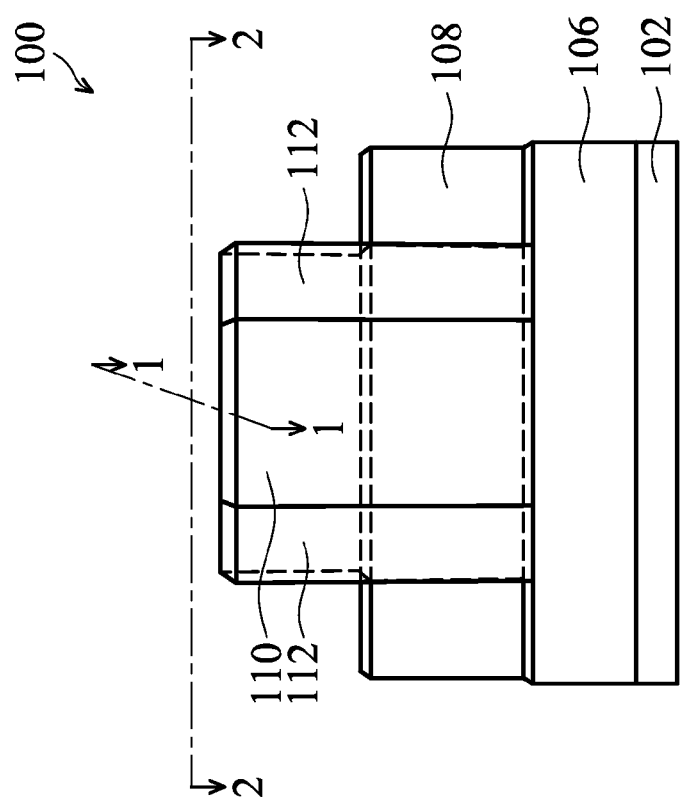

At operation 12, the method 10 (FIG. 1A) receives a substrate 102 with various structures formed therein and/or thereon. Refer to FIGS. 2A and 2B collectively. FIG. 2A is a perspective front view of the semiconductor device 100, while FIG. 2B is a perspective side view of the semiconductor device 100 along the "1-1" line of FIG. 2A. The device 100 includes the substrate 102 and an isolation structure 106 over the substrate 102. The substrate 102 includes an active fin 104 that projects upwardly through the isolation structure 106. The device 100 further includes an oxide layer 108, a dummy gate stack 110, and a spacer feature 112. The oxide layer 108 covers the active fin 104. The dummy gate stack 110 is over the isolation structure 106 and the oxide layer 108, and engages a portion of the active fin 104 along a width direction of the fin. The spacer feature 112 is over the isolation structure 106 and the oxide layer 108, and on sidewalls of the dummy gate stack 110. The various aforementioned structures of the device 100 will be further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

The fin 104 is suitable for forming a p-type FinFET or an n-type FinFET. The fin 104 may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fin 104 on the substrate 102. The etching process can include dry etching, wet etching, reactive ion etching (RIE), and/or other suitable processes. Alternatively, the fin 104 may be formed using mandrel-spacer double patterning lithography. Numerous other embodiments of methods to form the fins 104 may be suitable.

The isolation structure 106 may be formed of silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fin 104 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The oxide layer 108 may include a dielectric material such as silicon oxide ($SiO_2$) or nitrogen (N) doped $SiO_2$, and may be formed by chemical oxidation, thermal oxidation, atomic layer deposition (ALD), chemical vapor deposition (CVD), and/or other suitable methods. For example, the oxide layer 108 can be grown by a rapid thermal oxidation (RTO) process or in an annealing process comprising oxygen.

The dummy gate stack 110 engages the fin 104 on three sides of the fin in the present embodiment. Alternatively, it may engage the fin 104 on only two sides (not on top side) of the fin. It is termed "dummy" because it will be removed in a later step and will be replaced with a "real" gate stack such as a high-k metal gate in a "gate-last" process. The dummy gate stack 110 may include one or more material layers, such as a poly-silicon layer, a hard mask layer, a capping layer, and other suitable layers. In an embodiment, the dummy gate stack 110 comprises poly-silicon. The dummy gate stack 110 may be formed by suitable deposition processes such as low-pressure chemical vapor deposition (LPCVD) and plasma-enhanced CVD (PECVD). In an embodiment, the dummy gate stack is first deposited as blanket layers over the isolation structure 106. Then the blanket layers are patterned through a process including photolithography processes and etching processes thereby removing portions of the blanket layers and keeping the remaining portions over the isolation structure 106 and the oxide layer 108 as the dummy gate stack 110.

The spacer feature 112 is formed on sidewalls of the dummy gate stack 110. The spacer feature 112 includes a material different from the material(s) for the dummy gate stack 110. In an embodiment, the spacer feature 112 includes a dielectric material, such as silicon nitride or silicon oxynitride. In an example, the spacer feature 112 includes multiple layers, such as a seal layer adjacent to the dummy gate stack 110 and a main spacer layer adjacent to the seal layer. In an embodiment, after the dummy gate stack 110 has been formed, one or more spacer layers are formed by blanket depositing spacer materials over the device 100. Then, an anisotropic etching process is performed to remove portions of the spacer layers to form the spacer feature 112 as illustrated in FIGS. 2A and 2B.

At operation 14, the method 10 (FIG. 1A) forms doped source/drain features 116 in and/or on the fin 104 adjacent to the spacer feature 112. Various techniques can be used for operation 14, such as carbon implantation followed by laser annealing. In an embodiment, operation 14 includes an etching process followed by one or more epitaxy processes, wherein the etching process forms recesses 114 in the fin 104 and the epitaxy processes form the doped source/drain features 116 in the recesses, which are illustrated in FIGS. 3 and 4 respectively.

Figure 3:
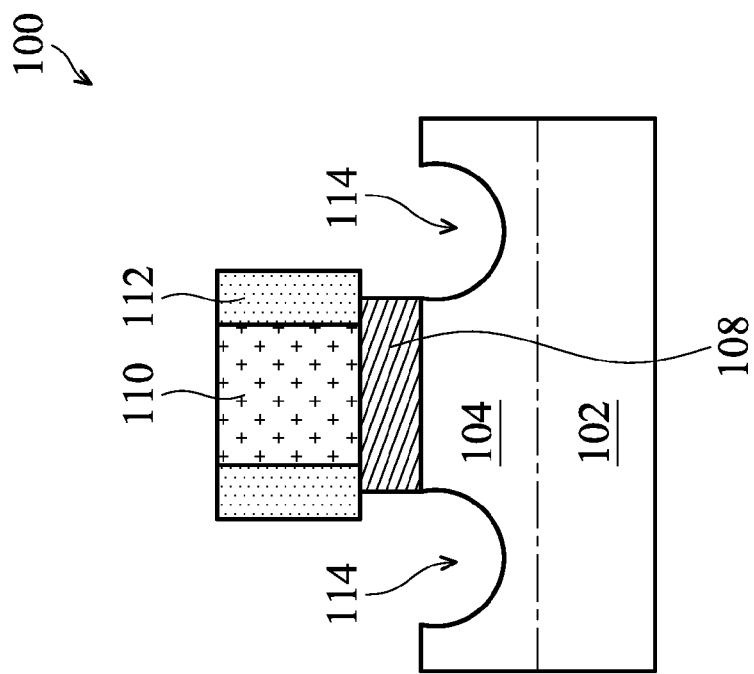

Referring to FIG. 3, two recesses 114 are formed in source/drain regions of the fin 104 by an etching process, which may be dry (plasma) etching, wet etching, and the like. In an embodiment, one or more photolithography processes are used to form masking elements such that the remaining regions of the device 100 are protected from the etching process; and then one or more of the etching processes are performed to remove portions of the oxide layer 108 and the fin 104 to form the recesses 114. After the etching process, a cleaning process may be performed that cleans the recesses 114 with a hydrofluoric acid (HF) solution or other suitable solution. As shown in FIG. 3, in an embodiment, the oxide layer 108 proximate to the recess 114 may be partially consumed during the etching process.

Figure 4:
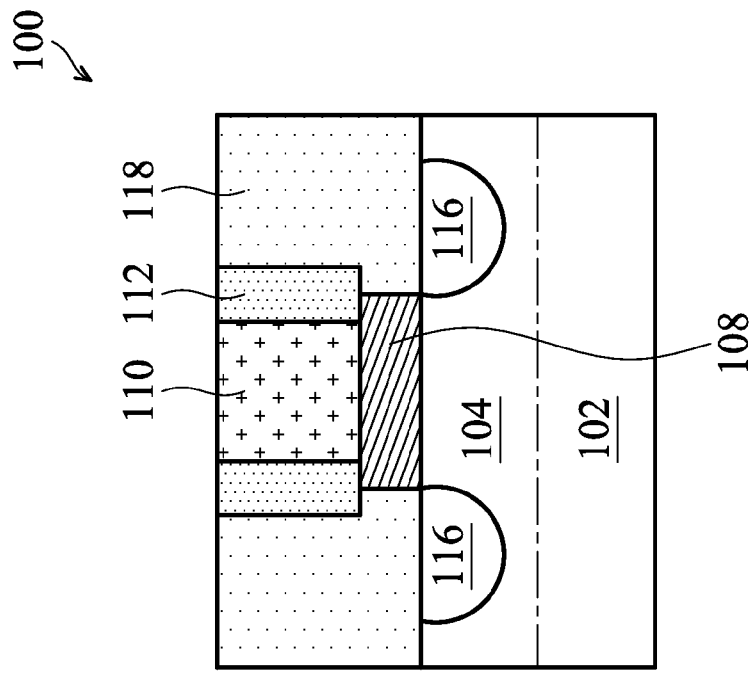

Referring to FIG. 4, the doped source/drain features 116 are formed in the recesses 114 (FIG. 3) by one or more epitaxial growth processes. In an embodiment, the epitaxial growth process is a low pressure chemical vapor deposition (LPCVD) process using a silicon-based precursor gas. In an example, the epitaxial growth process in-situ dopes the grown silicon with a p-type dopant for forming a p-type FinFET or an n-type dopant for forming an n-type FinFET. In an embodiment, an annealing process, such as a rapid thermal annealing (RTA) process, is applied to the doped source/drain features 116 to activate the dopant(s) thereof.

FIG. 4 further shows a dielectric layer 118 formed over the source/drain features 116. The dielectric layer 118 may include one or more material layers. In an embodiment, the dielectric layer 118 includes an inter-layer dielectric (ILD) layer over a contact etch stop layer (CESL). For example, the CESL may include a layer of silicon nitride, silicon oxide, silicon oxynitride, and/or other materials. The CESL may be formed by PECVD process and/or other suitable deposition or oxidation processes. The ILD layer may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the ILD layer may include a high density plasma (HDP) dielectric material (e.g., HDP oxide) and/or a high aspect ratio process (HARP) dielectric material (e.g., HARP oxide). The ILD layer may be deposited by a PECVD process or other suitable deposition technique. In an embodiment, the ILD layer is formed by a flowable CVD (FCVD) process. The FCVD process includes depositing a flowable material (such as a liquid compound) on the substrate 102 to fill trenches and converting the flowable material to a solid material by a suitable technique, such as annealing in one example. After various deposition processes, a chemical mechanical planarization (CMP) process is performed to planarize a top surface of the dielectric layer 118 and to expose a top surface of the dummy gate stack 110 for subsequent fabrication steps.

Figure 5:
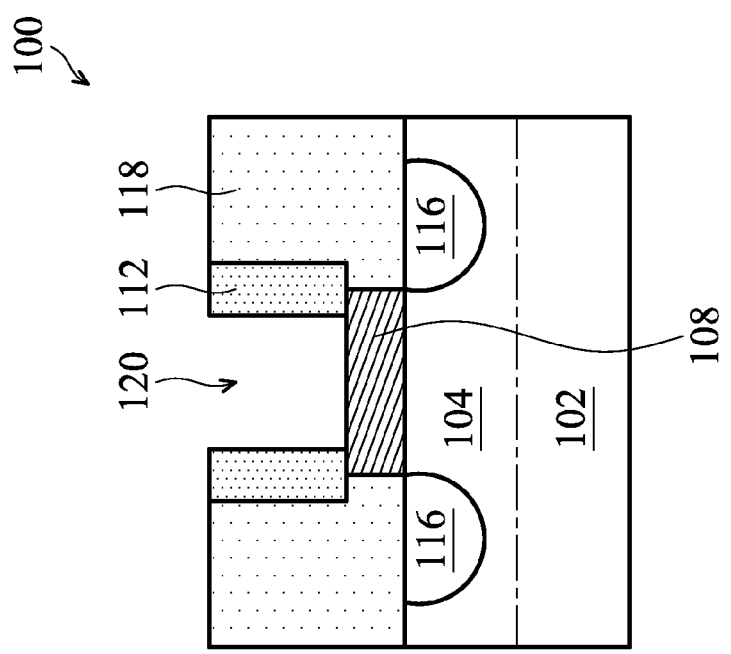

At operation 16, the method 10 (FIG. 1A) removes the dummy gate stack 110. Referring to FIG. 5, a trench 120 is thereby formed in the device 100, exposing the oxide layer 108 there through. The trench 120 is partially surrounded by the spacer 112, the oxide layer 108, and the isolation structure 106 (not shown in FIG. 5). In an embodiment, operation 16 includes one or more etching processes that are selectively tuned to remove the dummy gate stack 110 (FIG. 4) while the spacer feature 112 and the dielectric layer 118 substantially remain. The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, diluted HF (hydrofluoric acid), deionized water, TMAH (tetramethylammonium hydroxide), other suitable wet etching solutions, or combinations thereof.

Figure 6A:
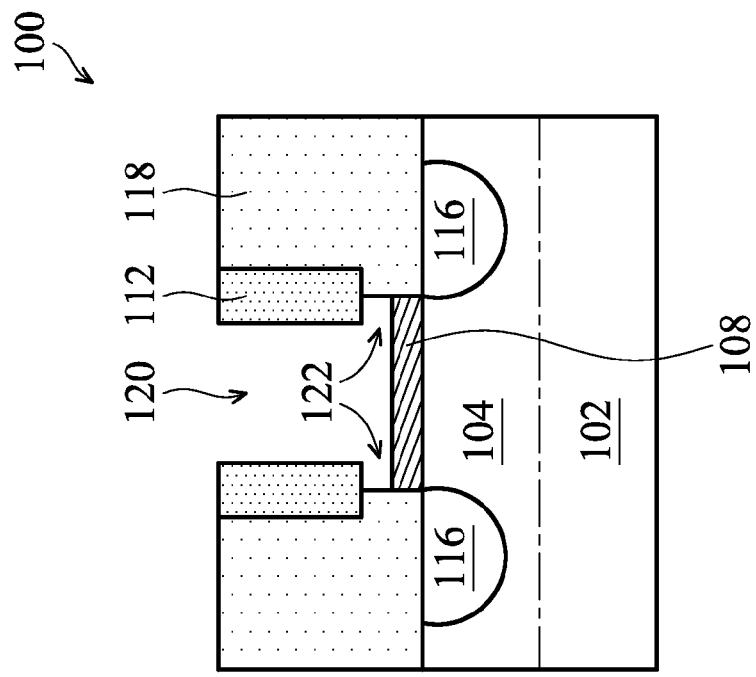
Figure 6B:
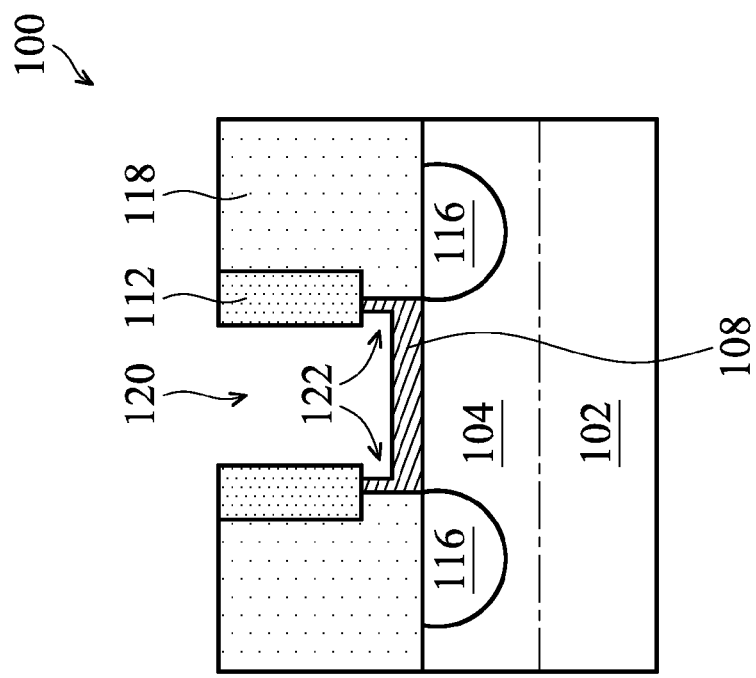
Figure 6C:
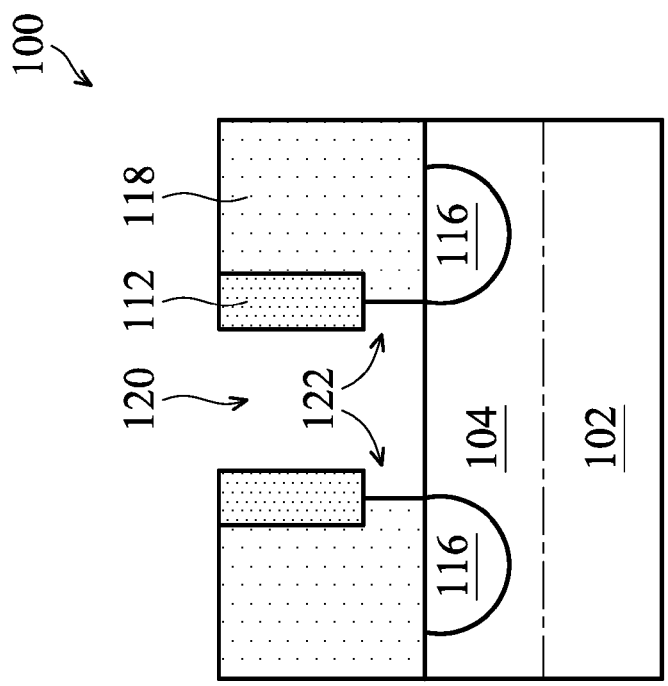
Figure 6D:
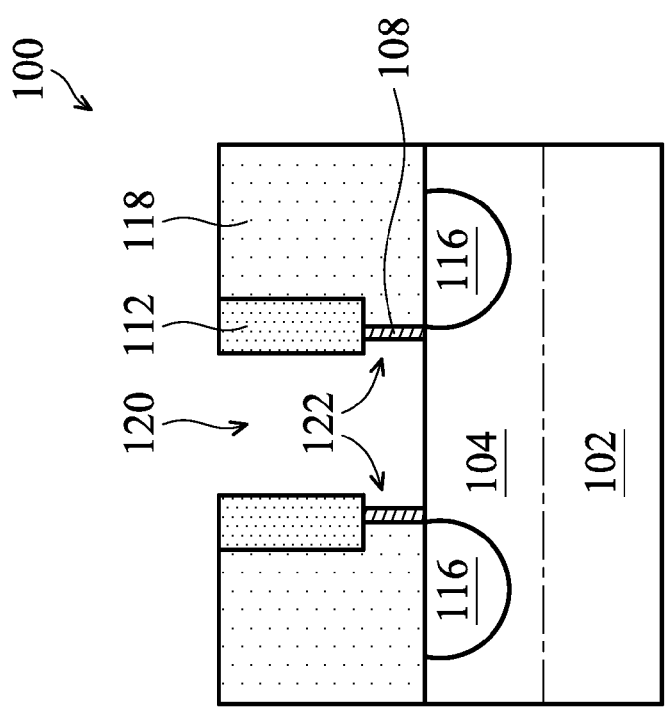

At operation 18, the method 10 (FIG. 1A) etches the oxide layer 108 through the trench 120. In an embodiment, operation 18 (e.g., operation 18a) partially removes the oxide layer 108, leaving a thin layer of oxide over the fin 104. In another embodiment, operation 18 (e.g., operation 18b) etches the oxide layer 108 so as to expose the fin 104 through the trench 120. FIGS. 6A-6D illustrate various embodiments of the device 100 after operation 18. Common in these embodiments is a cavity 122 underneath the spacer feature 112 that is formed by the etching process. More specifically, FIG. 6A shows that operation 18 partially removes the oxide layer 108 in the trench 120, leaving a thin layer of oxide over the fin 104. Further, the cavity 122 is partially surrounded by the oxide layer 108 and the spacer feature 112. In another embodiment, FIG. 6B shows that operation 18 partially removes the oxide layer 108 through the trench 120, leaving a thin layer of oxide over the fin 104. Further, the oxide layer 108 has been etched through laterally and the cavity 122 is partially surrounded by the oxide layer 108, the dielectric layer 118, and the spacer feature 112. In yet another embodiment, FIG. 6C shows that operation 18 has vertically etched through the oxide layer 108, thereby exposing the fin 104 through the trench 120. Further, the cavity 122 is partially surrounded by the fin 104, a portion of the oxide layer 108, and the spacer feature 112. In yet another embodiment, FIG. 6D shows that operation 18 removes the oxide layer 108 through the trench 120. Further, the cavity 122 is partially surrounded by the fin 104, the dielectric layer 118, and the spacer feature 112. Although not shown in FIGS. 6A-6D, the cavity 122 is also partially surrounded by a portion of the isolation structure 106 in various embodiments.

In an embodiment, the oxide layer 108 is etched using a suitable wet etch process, a dry (plasma) etch process, and/or other processes. For example, wet etching solutions may include $NH_4OH$, HF (hydrofluoric acid), TMAH (tetramethylammonium hydroxide), other suitable wet etching solutions, or combinations thereof. For example, a dry etching process may use chlorine-containing gases, fluorine-containing gases, other etching gases, or a combination thereof. In an embodiment, the oxide layer 108 is etched using a dry etching process performed at a temperature of about 20 to about 80 degrees Celsius with hydrogen, oxygen, nitrogen, or a mixture thereof as etching gases. Furthermore, partial removal of the oxide layer 108 may be controlled by etching time.

Figure 7B:
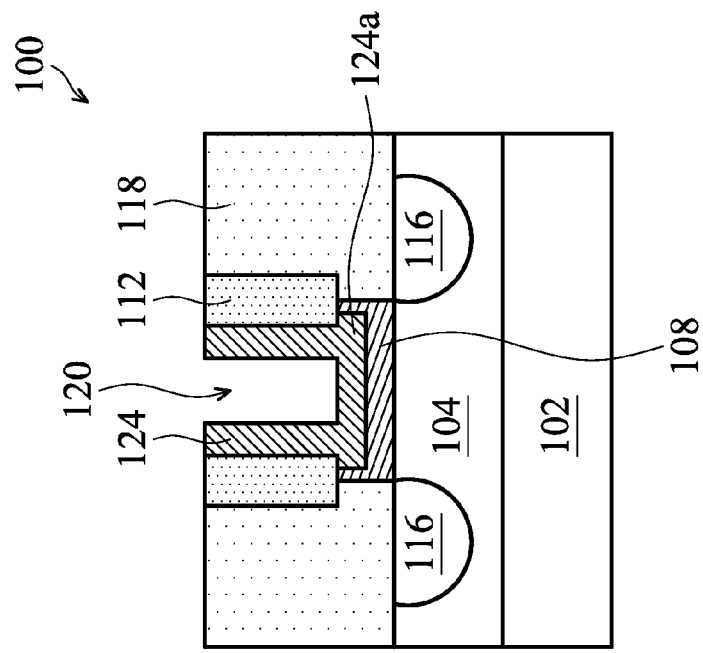
Figure 7A:
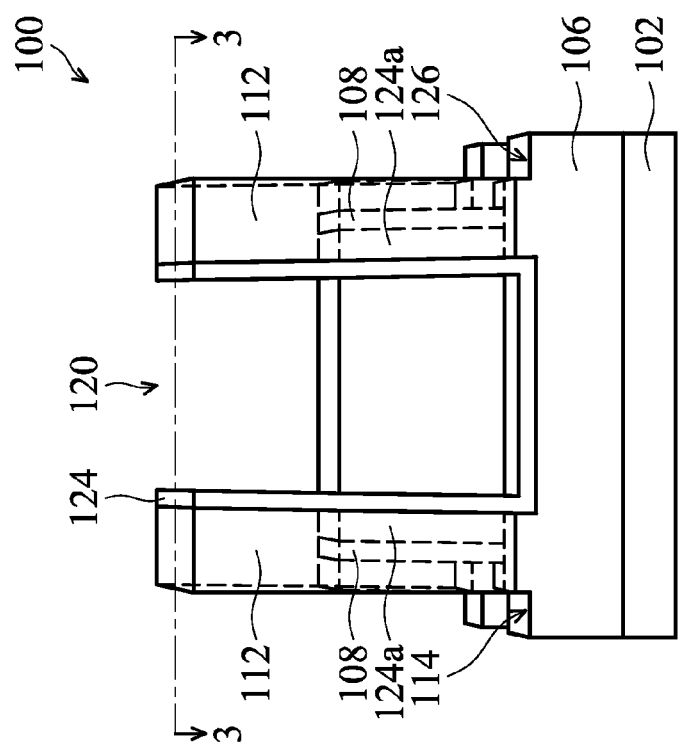

At operation 20, the method 10 (FIG. 1B) deposits a dielectric material in the trench 120 and in the cavity 122. Refer to FIGS. 7A and 7B. FIG. 7A is a simplified perspective view of the device 100 after operation 20, while FIG. 7B is a cross sectional view of the device 100 along the "3-3" line of FIG. 7A. For the sake of simplicity, FIG. 7A does not show the source/drain features 116 and the dielectric layer 118. Rather, it illustrates the recess 114 (see FIG. 3) that is etched into the fin 104 and the isolation structure 106. Particularly, FIG. 7A shows that, adjacent to the spacer feature 112, a portion of the isolation structure 106 has a recessed surface 126 due to one or more etching processes in operation 14 with reference to FIG. 3.

Referring to FIGS. 7A and 7B collectively, operation 20 forms a dielectric layer 124 on various bottom and side walls of the trench 120. In the embodiment shown in FIG. 7B, a portion of the oxide layer 108 remains over the fin 104 due to a partial removal thereof in operation 18 (see FIG. 6A). Therefore, the dielectric layer 124 is formed over the portion of the oxide layer 108, over a portion of the isolation structure 106 (see FIG. 7A), on sidewalls of the spacer feature 112, and particularly in the cavity 122 of FIG. 6A. For the convenience of discussion, the portion of the dielectric layer 124 inside the cavity 122 is referred to as the dielectric layer 124a. In an embodiment, the dielectric layer 124 includes a material that is different from that of the oxide layer 108. In an embodiment, the dielectric layer 124 includes a silicon nitride, such as $Si_xN_y$ (e.g., $Si_3N_4$). In an embodiment, the dielectric layer 124 includes silicon, nitrogen, and one of: oxygen, carbon, hydrogen, and a combination thereof. For an example, the dielectric layer 124 includes SiCON, SiON, or SiNH. In an embodiment, the dielectric layer 124 is formed by a chemical vapor deposition (CVD) process. In another embodiment, the dielectric layer 124 is formed by an atomic layer deposition (ALD) process. For example, a deposition process forming the dielectric layer 124 may be performed at a temperature of about 20 to about 500 degrees Celsius, under a pressure of about 0.1 to about 150 Torr, and with one or more gases containing silicon, carbon, oxygen, nitrogen, helium, argon, chlorine, or other suitable gases as precursor gases. In an embodiment for 16 nm FinFET process, the dielectric layer 124 is deposited to have a thickness about 10 to about 100 Å. To further this embodiment, an ALD process is used to accurately control the thickness of the dielectric layer 124.

Figure 8A:
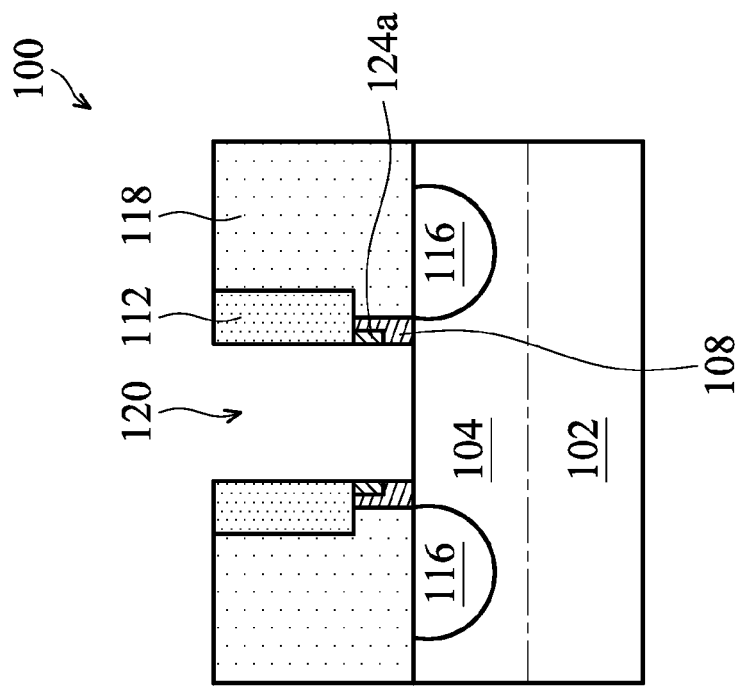
Figure 8B:
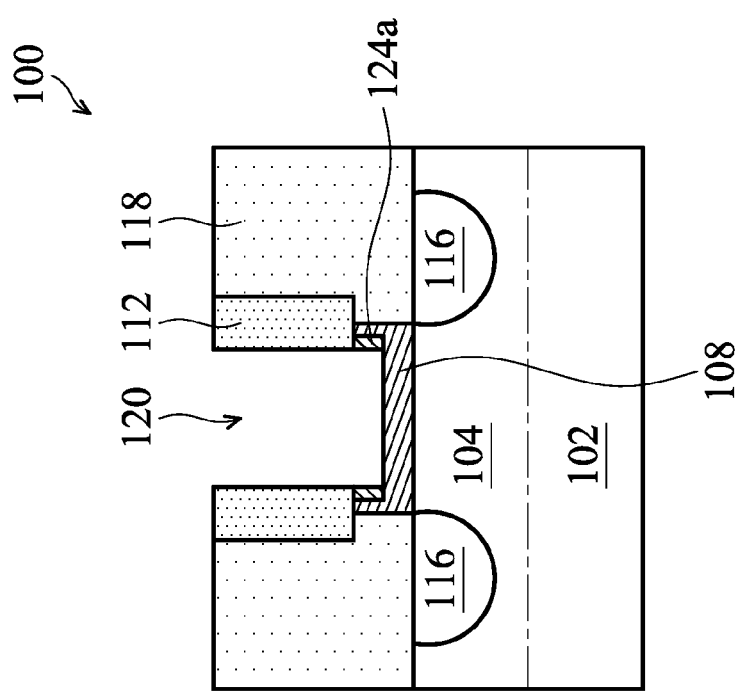
Figure 8C:
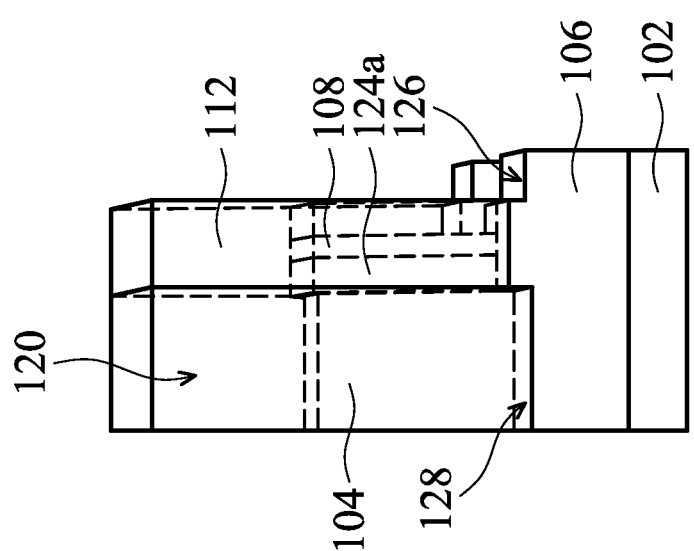
Figure 12:
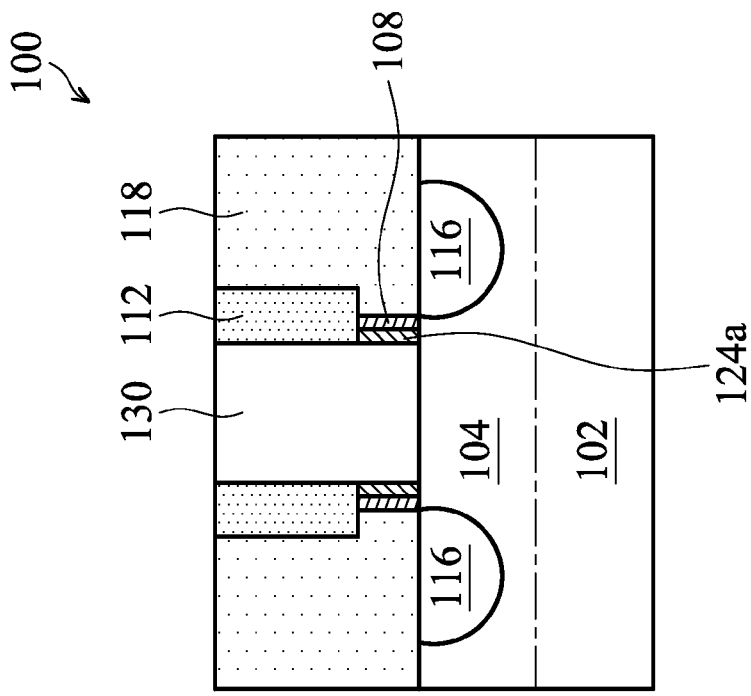
Figure 11:
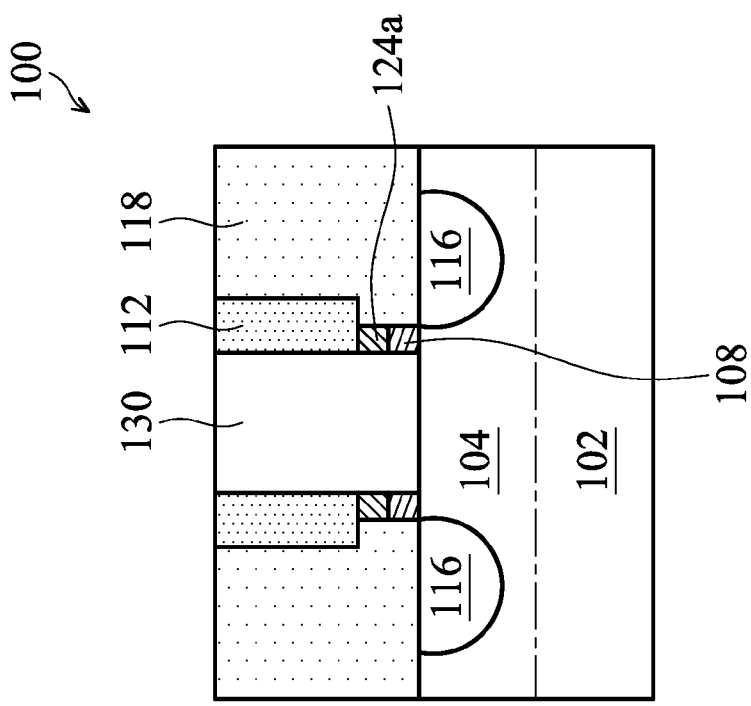
Figure 13:
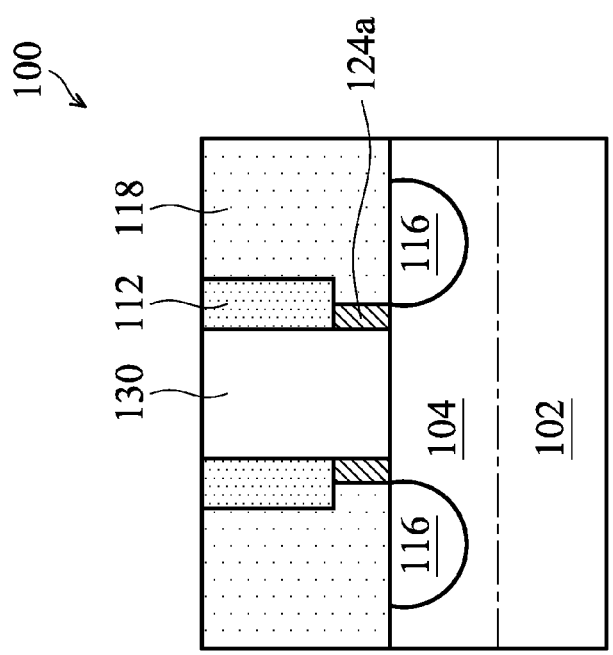

At operation 22, the method 10 (FIG. 1B) etches in the trench 120 so as to expose the fin 104. Referring to FIGS. 8A, 8B, and 8C, shown therein is an embodiment of the device 100 at various stages of operation 22 that involves one or more etching processes. In embodiments where there is a thin layer of the oxide layer 108 over the fin 104, such as shown in FIGS. 6A and 6B, operation 22 includes two etching processes. The first etching process is tuned to remove the dielectric layer 124 in the trench 120, exposing the oxide layer 108 underneath thereof (e.g., FIG. 8A). The second etching process is tuned to remove the thin oxide layer 108, exposing the fin 104 underneath thereof (e.g., FIG. 8B). The first and second etching processes use different etching recipes. In an embodiment, the first etching process is performed under a source power of about 50 to about 1,500 W, at a temperature of about 20 to about 80 degrees Celsius, under a pressure of about 1 to about 100 mTorr, and with one or more gases $CF_4$, $CH_3F$, $CH_2F_2$, $CHF_3$, $O_2$, HBr, He, $Cl_2$, Ar, and $N_2$ as etching gases. In an embodiment, the second etching process is performed under a source power of about 50 to about 1,500 W, at a temperature of about 20 to about 80 degrees Celsius, under a pressure of about 1 to about 100 mTorr, and with one or more gases $H_2$, $CH_4$, $Cl_2$, HBr, $NF_3$, He, Ar, $N_2$, $CF_4$, $CH_3F$, $CH_2F_2$, $CHF_3$, and $O_2$ as etching gases. In embodiments where the fin 104 is exposed in operation 18 such as shown in FIGS. 6C and 6D, operation 22 removes the dielectric layer 124 on sidewalls of the spacer feature 112 and over the fin 104. In various embodiments, the dielectric layer 124a remains in the cavity 122 (FIGS. 6A-6D). Thus, in the embodiment shown in FIG. 8B, after operation 22, a first portion of the oxide layer 108 is under the dielectric layer 124a and a second portion of the oxide layer 108 is under the spacer feature 112 and adjacent to the dielectric layer 124a. More profiles of the FinFET 100 are shown in FIGS. 11-13 and will be discussed later.

FIG. 8C shows a perspective view of the device 100 after operation 22. Comparing FIG. 8C to FIG. 7A, portions of the dielectric layer 124 have been removed in operation 22, exposing the fin 104 and a top surface 128 of the isolation structure 106 in the trench 120. The dielectric layer 124a remains under the spacer feature 112, filling the cavity 122 (e.g., FIGS. 6A-6D). A portion of the oxide layer 108 (see e.g., FIGS. 6A and 6C) remains under the spacer feature 112, adjacent to the dielectric layer 124a.

Figure 9:
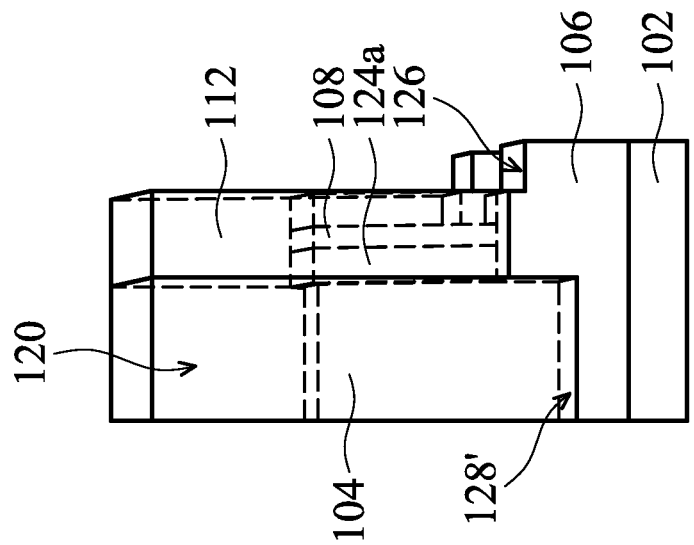

At operation 24, the method 10 (FIG. 1B) etches the isolation structure 106 through the trench 120. Referring to FIG. 9, the isolation structure 106 is etched to have a top surface 128' that is below the top surface 128, thereby increasing a height of the fin 104 above the isolation structure 106. In various embodiments, the etching of the isolation structure 106 is well controlled to achieve a desirable fin height so as to fine tune work function of the FinFET. This is useful for boosting or fine tuning device performance. In an embodiment, the surface 128' is etched below the surface 126, for example, by about 5 to about 1,500 Å. This, again, provides benefits of boosting or fine tuning device performance. For example, this may increase the strain effects applied by the source/drain features 116 (e.g., FIG. 8B). In various embodiments, the etching process is tuned to remove the material for the isolation structure 106 but the dielectric layer 124a substantially remains. In an embodiment, operation 24 is performed under a source power of about 50 to about 1,500 W, at a temperature of about 20 to about 80 degrees Celsius, under a pressure of about 1 to about 100 mTorr, and with one or more gases $Cl_2$, HBr, $NF_3$, He, Ar, and $N_2$ as etching gases.

Figure 10B:
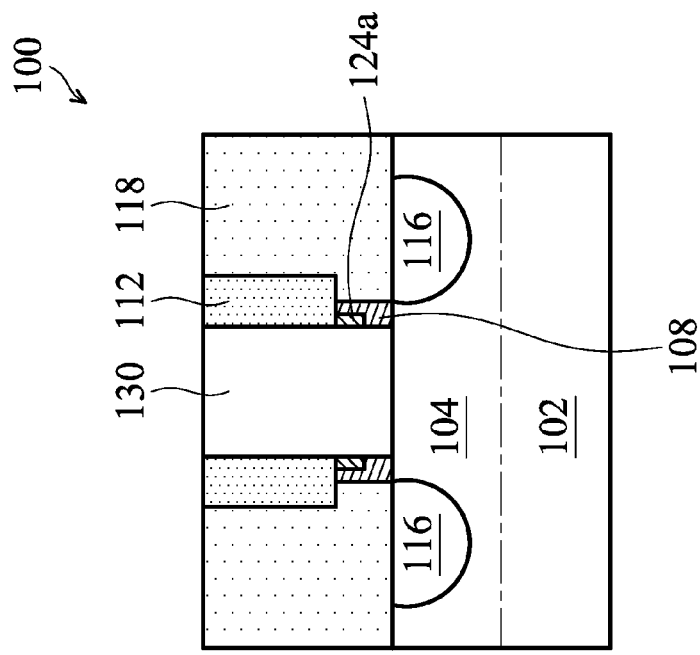
Figure 10A:
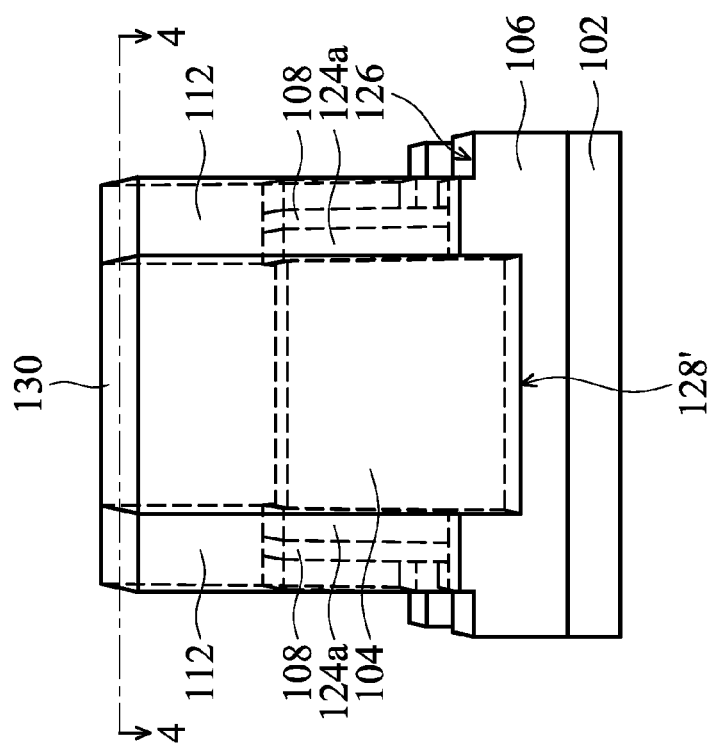

At operation 26, the method 10 (FIG. 1B) forms a gate stack 130 in the trench 120. Refer to FIGS. 10A and 10B. FIG. 10A shows a schematic perspective view of the device 100, while FIG. 10B shows a cross sectional view of the device 100 along the "4-4" line of FIG. 10A. The gate stack 130 is formed over the surface 128' of the isolation structure 106 and engages the fin 104 on three sides thereof. The sidewalls of the gate stack 130 are adjacent to the spacer feature 112 and the dielectric layer 124a. In the embodiment shown in FIG. 10B, the sidewalls of the gate stack 130 are also adjacent to a portion of the oxide layer 108. In various embodiments, the gate stack 130 includes one or more metal layers. The spacer feature 112, the dielectric layer 124a, and the oxide layer 108 collectively prevent metal materials from diffusing into nearby regions or features, such as the source/drain features 116. In an embodiment, the gate stack 130 includes a high-k dielectric layer and a work function metal layer. In an embodiment, the gate stack 130 includes an interfacial layer, a dielectric layer, a work function metal layer, and a fill layer. The interfacial layer may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The dielectric layer may include a high-k dielectric material such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. The work function metal layer may be a p-type or an n-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function metal layer may include a plurality of layers and may be deposited by CVD, PVD, and/or other suitable process. The fill layer may include aluminum (Al), tungsten (W), cobalt (Co), copper (Cu), and/or other suitable materials. The fill layer may be formed by CVD, PVD, plating, and/or other suitable processes. A CMP process may be performed to remove excess materials from the gate stack 130 so as to planarize a top surface of the device 100.

FIGS. 11-13 illustrate various profiles of the device 100 after operation 26. Referring to FIG. 11, an embodiment of the device 100 as shown in FIG. 6B has been processed by operations 20 through 26 as discussed above. The gate stack 130 engages the fin 104. The sidewalls of the gate stack 130 are adjacent to the spacer feature 112, the dielectric layer 124a, and a portion of the oxide layer 108. Specifically, the dielectric layer 124a is over the portion of the oxide layer 108 which is over the fin 104. Both the dielectric layer 124a and the portion of the oxide layer 108 are underneath the spacer feature 112.

Referring to FIG. 12, an embodiment of the device 100 as shown in FIG. 6C has been processed by operations 20 through 26 as discussed above. The gate stack 130 engages the fin 104. The sidewalls of the gate stack 130 are adjacent to the spacer feature 112 and the dielectric layer 124a. A portion of the oxide layer 108 is under the spacer feature 112 and adjacent to the dielectric layer 124a.

Referring to FIG. 13, an embodiment of the device 100 as shown in FIG. 6D has been processed by operations 20 through 26 as discussed above. The gate stack 130 engages the fin 104. The sidewalls of the gate stack 130 are adjacent to the spacer feature 112 and the dielectric layer 124a.

In various embodiments shown in FIGS. 10A-13, the device 100 has a FinFET profile that effectively prevents metal materials of the gate stack 130 from diffusing into nearby regions, such as the source/drain features 116. The dielectric layer 124a, in some cases with a portion of the oxide layer 108, serves as a metal diffusion block layer.

At operation 28, the method 10 (FIG. 1B) performs further operations to form a final device. For example, operation 28 may form contacts and vias electrically connecting the source/drain features 116 and the gate stack 130 and form metal interconnects connecting the FinFET to other portions of the device 100 to form a complete IC.

Although not intended to be limiting, one or more embodiments of the present disclosure provide many benefits to a semiconductor device and the formation thereof. For example, embodiments of the present disclosure provide methods for forming a FinFET profile that effectively blocks gate metal materials from intruding into source/drain regions. Embodiments of the FinFET profile can be tuned to enlarge process window and to boost device performance. Various embodiments of the present disclosure can be easily integrated into existing FinFET fabrication flow for 16 nm and smaller process nodes.

In one exemplary aspect, the present disclosure is directed to a method of forming a semiconductor device. The method includes receiving a substrate having an active fin, an oxide layer over the active fin, a dummy gate stack over the oxide layer, and a spacer feature over the oxide layer and on sidewalls of the dummy gate stack. The method further includes removing the dummy gate stack, resulting in a first trench. The method further includes etching the oxide layer in the first trench, resulting in a cavity underneath the spacer feature. The method further includes depositing a dielectric material in the first trench and in the cavity. The method further includes etching in the first trench so as to expose the active fin, leaving a first portion of the dielectric material in the cavity. In an embodiment, the method further includes forming a gate stack in the first trench, the gate stack engaging the active fin.

In another exemplary aspect, the present disclosure is directed to a method of forming a semiconductor device. The method includes receiving a substrate having an active fin projecting upwardly through an isolation structure over the substrate, an oxide layer over the active fin, a dummy gate stack over the isolation structure and the oxide layer, and a spacer feature over the isolation structure and the oxide layer and on sidewalls of the dummy gate stack. The method further includes removing the dummy gate stack thereby forming a first trench, wherein the first trench exposes the oxide layer. The method further includes partially removing the oxide layer in the first trench, resulting in a cavity under the spacer feature and a portion of the oxide layer over the active fin. The method further includes depositing a dielectric material in the first trench and in the cavity, and etching in the first trench so as to expose the active fin, leaving a first portion of the dielectric material under the spacer feature. The method further includes forming a gate stack in the first trench, the gate stack engaging the active fin.

In another exemplary aspect, the present disclosure is directed to a semiconductor device. The semiconductor device includes a substrate having an active fin projecting upwardly through an isolation structure over the substrate; a gate stack over the isolation structure and engaging the active fin; a silicon nitride layer over the active fin and adjacent to the gate stack; and a spacer feature over the isolation structure, over the silicon nitride layer, and on sidewalls of the gate stack. In an embodiment, the semiconductor device further includes a silicon oxide layer under the spacer feature, over the active fin, and adjacent to the silicon nitride layer. In an embodiment, the semiconductor device further includes a silicon oxide layer between the active fin and the silicon nitride layer. In some embodiments of the semiconductor device, the gate stack is formed over a first surface of the isolation structure, the spacer feature is formed over a second surface of the isolation structure, and the first surface is below the second surface from a cross sectional view. In an embodiment of the semiconductor device, the gate stack includes a high-k dielectric layer and a work function metal layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   receiving a substrate having an active fin, an oxide layer over the active fin, a dummy gate stack over the oxide layer, and a spacer feature over the oxide layer and on sidewalls of the dummy gate stack;
   removing the dummy gate stack, resulting in a first trench;
   etching the oxide layer in the first trench, resulting in a cavity extending laterally underneath the spacer feature;
   depositing a dielectric material in the first trench and in the cavity; and
   etching in the first trench so as to expose the active fin, leaving a first portion of the dielectric material in the cavity.

2. The method of claim 1, wherein the etching of the oxide layer exposes the active fin.

3. The method of claim 1, wherein the etching of the oxide layer partially removes the oxide layer, leaving a portion of the oxide layer over the active fin in the first trench.

4. The method of claim 3, wherein the etching in the first trench includes first and second etching processes, the first etching process is tuned to etch the dielectric material, and the second etching process is tuned to etch the portion of the oxide layer.

5. The method of claim 1, wherein the depositing of the dielectric material uses one of: atomic layer deposition and chemical vapor deposition.

6. The method of claim 1, wherein the dielectric material includes a silicon nitride.

7. The method of claim 6, wherein the dielectric material includes one of: oxygen, carbon, hydrogen, and a combination thereof.

8. The method of claim 1, wherein the dummy gate stack is formed over an isolation structure over the substrate, further comprising, before the forming of the gate stack:
   etching the isolation structure in the first trench.

9. The method of claim 1, further comprising:
   forming a gate stack in the first trench, the gate stack engaging the active fin.

10. The method of claim 9, wherein the gate stack includes a high-k dielectric layer and a work function metal layer.

11. A method of forming a semiconductor device, comprising:
- receiving a substrate having an active fin projecting upwardly through an isolation structure over the substrate, an oxide layer over the active fin, a dummy gate stack over the isolation structure and the oxide layer, and a spacer feature over the isolation structure and the oxide layer and on sidewalls of the dummy gate stack;
- removing the dummy gate stack thereby forming a first trench, wherein the first trench exposes the oxide layer;
- partially removing the oxide layer in the first trench, resulting in a cavity under the spacer feature and a portion of the oxide layer over the active fin;
- depositing a dielectric material in the first trench and in the cavity;
- etching in the first trench so as to expose the active fin, leaving a first portion of the dielectric material under the spacer feature; and
- forming a gate stack in the first trench, the gate stack engaging the active fin.

12. The method of claim 11, wherein the etching in the first trench includes first and second etching processes, the first etching process removes the dielectric material in the first trench, the second etching process exposes the active fin in the first trench, and the first and second etching processes use different etching recipes.

13. The method of claim 11, wherein a first portion of the oxide layer is under the dielectric material in the cavity and a second portion of the oxide layer is under the spacer feature and adjacent to the dielectric material.

14. The method of claim 11, further comprising, before the forming of the gate stack:
- etching the isolation structure in the first trench.

15. The method of claim 14, wherein:
- the spacer feature interposes the first trench and a first portion of the isolation structure; and
- the isolation structure in the first trench is etched to have a top surface below another top surface of the first portion of the isolation structure.

16. The method of claim 11, wherein the dielectric material includes a silicon nitride.

17. The method of claim 11, wherein the dielectric material includes silicon, nitrogen, and one of: oxygen, carbon, hydrogen, and a combination thereof.

18. The method of claim 11, wherein the first portion of the dielectric material interposes the spacer feature and the oxide layer.

19. The method of claim 11, wherein the first portion of the dielectric material interposes the oxide layer and the gate stack.

20. The method of claim 11, wherein the dielectric material and the oxide layer comprise different materials.

* * * * *